United States Patent
Farassat

(10) Patent No.: US 6,827,248 B2
(45) Date of Patent: Dec. 7, 2004

(54) CUTTING DEVICE FOR BONDED WIRES

(75) Inventor: Farhad Farassat, Taufkirchen (DE)

(73) Assignee: F & K Delvotec Bondtechnik GmbH, Ottobrunn (DE)

(*) Notice: Subject to any disclaimer, the term of this patent is extended or adjusted under 35 U.S.C. 154(b) by 70 days.

(21) Appl. No.: 10/214,804

(22) Filed: Aug. 6, 2002

(65) Prior Publication Data
US 2003/0192414 A1 Oct. 16, 2003

(30) Foreign Application Priority Data

Apr. 12, 2002 (EP) .............................. 02008416

(51) Int. Cl.[7] .................. B23K 37/00; B23K 31/02; B23K 1/20
(52) U.S. Cl. .................... 228/4.5; 228/8; 228/13; 228/160; 228/180.5
(58) Field of Search ............... 228/160, 4.5, 180.5, 228/102, 8, 13; 219/56.1, 56.21, 56.22, 85.18; 83/140; 29/850

(56) References Cited

U.S. PATENT DOCUMENTS

| | | | | |
|---|---|---|---|---|
| 3,706,122 A | * | 12/1972 | La Valle | 29/38 R |
| 4,976,392 A | * | 12/1990 | Smith et al. | 228/102 |
| 5,365,657 A | * | 11/1994 | Brown et al. | 29/850 |
| 5,400,503 A | * | 3/1995 | Komoriya et al. | 29/850 |
| 6,206,275 B1 | | 3/2001 | Biggs | |
| 6,276,588 B1 | * | 8/2001 | Johnson | 228/13 |
| 6,439,448 B1 | * | 8/2002 | Ringler | 228/110.1 |

FOREIGN PATENT DOCUMENTS

DE    932 1 269 U    1/1997

* cited by examiner

Primary Examiner—L. Edmondson
(74) Attorney, Agent, or Firm—Knobbe, Martens, Olson & Bear, LLP

(57) ABSTRACT

Bond-wire cutting device for cutting off the part of a bond wire that extends beyond the bonding contact area after a bonded connection has been produced, with a knife that can be moved with a movement component perpendicular to the surface of a substrate and hence to the bonding contact area, wherein the knife is mounted so as to be yielding with respect to the movement component perpendicular to the substrate surface, so that the force acting on the cutting edge of the knife when the knife encounters the substrate is limited to a prespecified peak value.

22 Claims, 4 Drawing Sheets

CUTTING DEVICE FOR BONDED WIRES

RELATED APPLICATIONS

This application claims the benefit of the Application Number 02 008 416.6 filed in the European Patent Office on Apr. 12, 2002.

BACKGROUND OF THE INVENTION

1. Field of the Invention

The invention relates to a cutting device for bonded wires according to the precharacterizing clause of claim 1. In addition it relates to the use of such a device in a wire bonder, specifically a so-called thick-wire bonder.

2. Description of the Related Art

Cutting devices of this kind have long been known in wire bonders.

Wire bonders of many designs are in practical use, which produce a bonded contact by pressing a wire onto a substrate by means of a bonding tool (e.g., wedge) and using the tool to apply ultrasonic oscillations, causing the wire to become firmly fused to the substrate. For this purpose the bonding tool is disposed on a bonding head that is perpendicular to the substrate surface, and hence to the surface of the contact area for bonding, and can be moved up and down. To move the bonding head as required, suitable driving and drive-control means are provided. The substrate in turn is displaceable, in a plane substantially perpendicular to the direction of movement of the bonding head, so that bonded contacts can be produced at various places.

Unlike earlier bonding apparatus, which customarily comprises a plurality of drivers for the bonding head itself and the bonding tool, as well as in some cases for clamping devices to grip the wire to be bonded and for a knife to cut through the wire, the wire-bonder construction according to the applicant's patent DE-U-93 21 269 introduced substantial simplifications and provided increased functional reliability and dimensional accuracy of the components being processed.

However, the working life of the knife used to cut the wire after production of the bonded connection has proved not yet to be satisfactory, and a need for improvement has also been discernible with respect to the quality of the cuts that allow the excess wire to be removed.

SUMMARY OF THE INVENTION

The objective of the invention is thus to provide an improved cutting device for bonded wire which, in particular, delivers qualitatively improved cuts along with an increased working life of the knife.

This objective is achieved by a wire-cutting device with the characteristics given in claim 1.

The invention includes the fundamental idea of a yielding or damped holder for the knife that cuts the bonded wire. This novel holder is intended to limit the peak forces that occur when the knife is applied to the bonded contact—in particular to the substrate after the bonded wire has been transected.

This limitation of peak force results, firstly, in clean cuts, and secondly it extends the life span of the knife by two- to three-fold, according to the inventor's experience thus far. In addition, the risk of breakage is considerably reduced; knife fractures have practically been abolished with the new holder.

In a first preferred embodiment of the invention the knife is fastened to a holder with predetermined elasticity, which ensures that it will yield slightly in the direction of knife movement (i.e., substantially also the direction of movement of the bonding tool, which in the following will also be termed the Z direction). An elastic resilience in the range of a few hundredths of a millimeter is entirely adequate for the desired purpose; of course, the precise dimensioning of the holder should be adjusted according to the structure and intended application of the wire bonder.

In a more specialized embodiment this holder is designed to allow bending, in particular is provided with a flexibly bending connection between the knife and a force-transfer element that transmits the vertical movement component. In an especially simple embodiment this is achieved by a leaf-spring construction, into which there is inserted in particular at least one elastomer block for additional damping. Such a holder in some ways resembles the holder that attaches the bonding tool to the ultrasound exciter (transducer). In the inventor's opinion at present, this holder is the preferred variant.

Alternatively, however, a seating that is elastic under compression can be provided, which for example, in a simple embodiment, comprises an elastomer element that is elastically distortable or compressible in the direction of the long axis of knife and force-transfer element.

Finally, the concept of the invention can be also be implemented with a hydraulic or pneumatic bearing of the knife on the piston of a piston-cylinder apparatus with a pressure-limiting element. The pressure-limiting element in particular is a simple pressure-relief valve.

In another preferred embodiment of the invention there is provided a means for adjusting the flexibility or the damping behaviour of the knife holder and/or a stopping device to limit the deflection of the knife owing to its ability to yield. Especially preferred in this regard is an adjustable stop, which is both responsible for limiting deflection and, when it is displaced, enables variation of the elasticity or damping properties, which are largely predetermined by the construction of the knife holder.

The flexibly mounted knife can be driven by a separate drive unit—however, it is more economical and simpler to provide a common drive for bonding tool and knife, i.e. for all movements of the relevant tools associated with the bonding head in the direction of the Z axis.

A particular aim of the invention is that the proposed cutting device for bonded wires also be applicable in a wire bonder wherein the knife is mounted to its bonding head with a predetermined degree of flexibility.

BRIEF DESCRIPTION OF THE DRAWINGS

Further advantages and useful features of the invention will be apparent from the subordinate claims as well as from the following description of a preferred exemplary embodiment with reference to the attached drawings, wherein

DETAILED DESCRIPTION OF THE PREFERRED EMBODIMENTS

Figure 1:
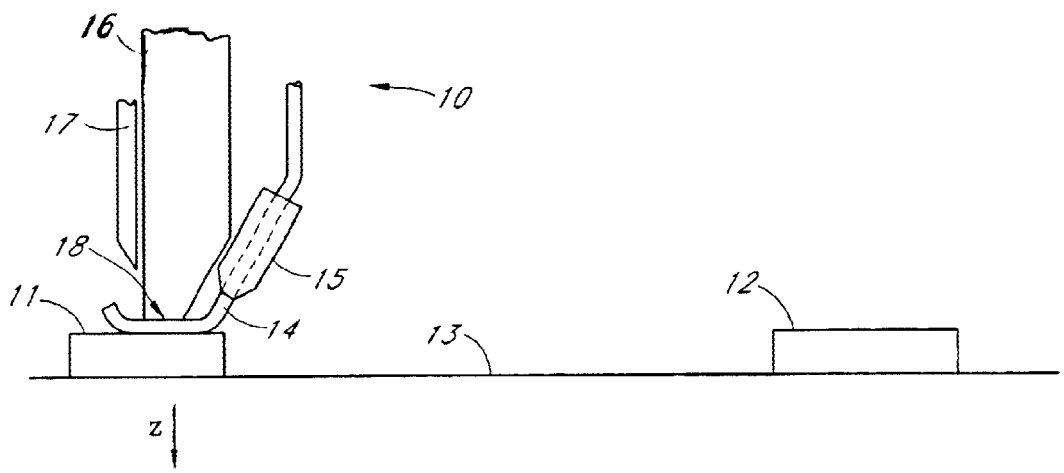
FIGS. 1 to 7 show individual steps in the course of a typical bonding process, including the step in which an excess length of the bonded wire is cut away.

A thick-wire bonder of advanced construction, such as is described in greater detail in the above-mentioned patent DE-U-93 21 269, operates basically as follows.

First the bonding head is rotated into the bonding direction and from this starting position it is lowered to a first contact area at the bonding height, carrying a wire with it. There follows a so-called "touch-down" of a wedge disposed on the bonding head, while the wedge is excited by ultrasound. In this process, a first bond is created. Then the bonding head is moved along a prespecified curve in space to a second contact area, thus forming a so-called "loop".

The next step is a new touch-down of the wedge disposed on the bonding head, again with ultrasound excitation of the wedge, so that a second bond is formed. Thereafter, the bonding head is again moved back, somewhat upward and to the side, i.e. away from the wire-application direction, to form a so-called "tail length". If the wire knife is situated behind the wedge, with respect to the direction in which the wire is applied, the bonding head is moved backward, while drawing out the tail length of wire, far enough that the knife is positioned apart from the bonding site. Then the bonding head is lowered again until the wire knife comes into action, cutting into the wire only partway. Subsequently the bonding head is raised and pulled back so as to tear the wire away at the cutting or separation point.

When the knife is disposed between wedge and wire-guidance tubule, the first tail-length movement of the bonding head is no longer necessary, which allows the processing speed to be increased. With the first construction, however, in which the knife is disposed behind the wedge, it is possible to produce better, i.e. more precise loops of small dimensions; then a somewhat lower processing speed can be accepted.

The described backward movement of the bonding head can also be replaced by a corresponding forward movement of the substrate. The point is merely that there must be a relative movement between bonding head and substrate with its contact areas.

In FIGS. 1 to 7 are shown the parts of a wire bonder 10 (not shown in its entirety) for producing a bonded-wire connection between two contact areas 11 and 12 on a component 13 by means of a wire 14, namely a wire-guidance tubule 15, a wedge 16 and a knife 17.

In the state shown in FIG. 1, the wedge 16 has been lowered to the first contact area 11 on the component 13 (on a substrate not shown in detail), so that the wire 14 is between wedge and surface. By a means not shown in detail here, the bond wire 14 is carried along by the bonding head, or pushed out through the wire-guidance tubule 15 as the head moves. FIG. 1 shows the touch-down of the wedge 16, which is accompanied by ultrasound excitation by means of a transducer (not shown) in order to form a first bond 18 on the contact area 11. While in this state the wedge 16 projects downward in the Z direction, beyond the knife 17 and the wire-guidance tubule 15; hence the knife is not yet acting on the bond wire.

Figure 2:
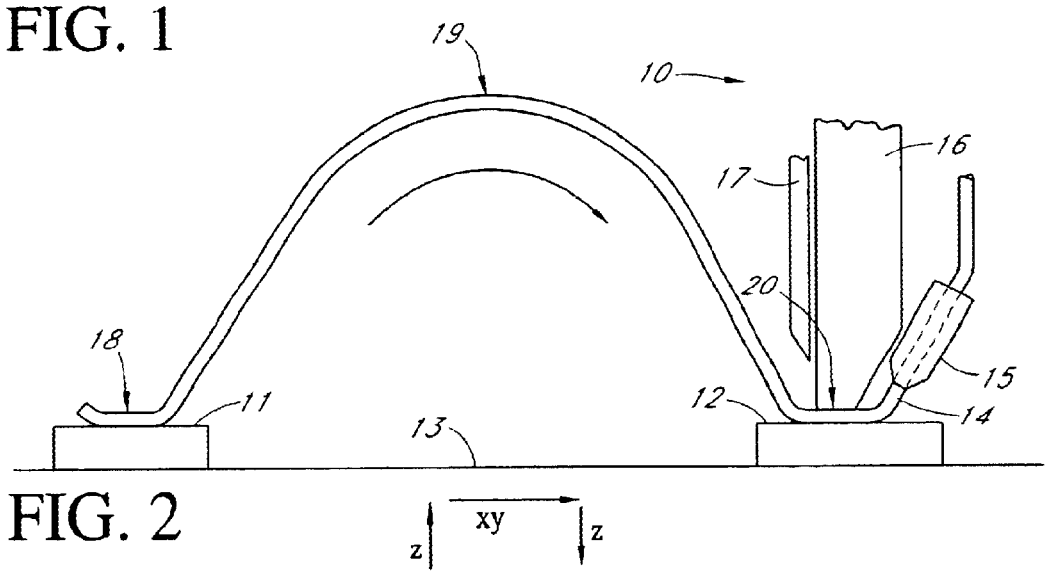

As shown in FIG. 2, the bonding head (and with it the wedge 16, the wire-guidance tubule 15 and the knife 17) is moved to the second contact area 12 in such a way as to form a loop 19 of bond wire, namely in the following composite sequence: lifted, laterally displaced, lowered, as indicated by the arrows labelled z and xy below the component surface 13. There a new touch-down occurs, creating a second bond 20. Here, again, the wedge projects beyond the free end of the knife 17 and the lower end of the wire-guidance tubule 15, so that it is the only element to touch the bond wire, and under excitement by ultrasound it produces the second bonded connection.

Figure 3:
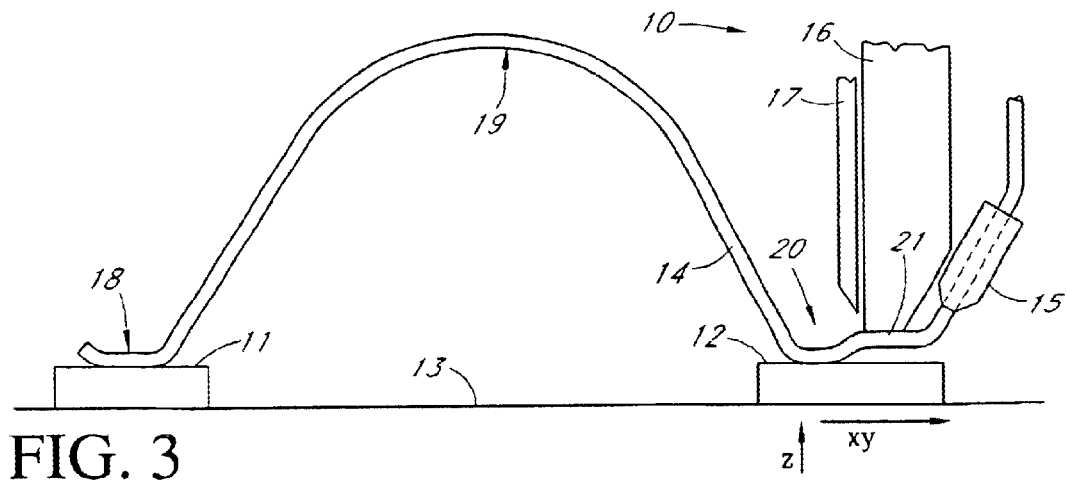
Figure 4:
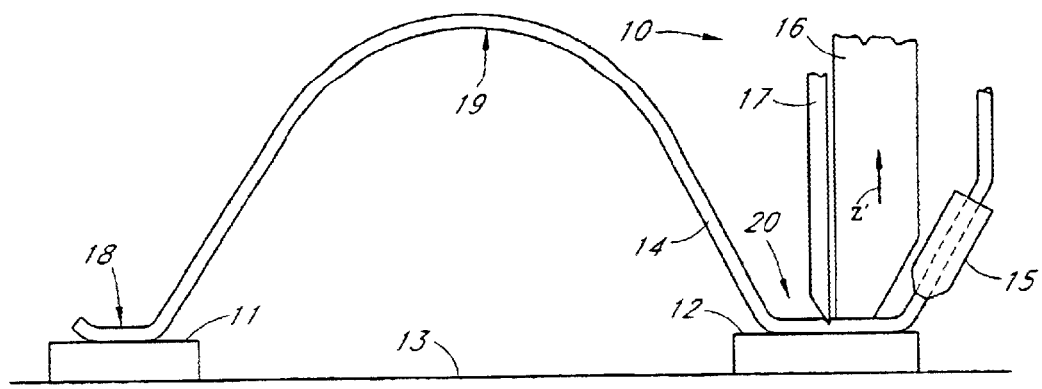

Then, as illustrated in FIG. 3, the bonding head with wedge, wire-guidance tubule and knife is lifted slightly and moved further along, in the original movement direction within the XY plane, as indicated by the z- and xy-arrows below the second contact area 12. The bond wire 14 is carried along, thus producing the tail length 21. When this movement has been completed, the knife 17 is in a position lateral to the second bond 20. As shown in FIG. 4, while remaining in this lateral position the bonding head—together with the wire-guidance tubule 15 and the knife 17—is then lowered as indicated by the z-arrow under the second contact area 12. At the same time, the wedge 16 is shifted relative to the bonding head in the opposite direction, as shown by the arrow z'. As a result, the cutting edge of the knife 17 is now below both the undersurface of the wedge 16 and the lower end of the wire-guidance tubule 15, so that the knife 17 acts on the bond wire 14 so as to cut through or at least into the latter.

Figure 5:
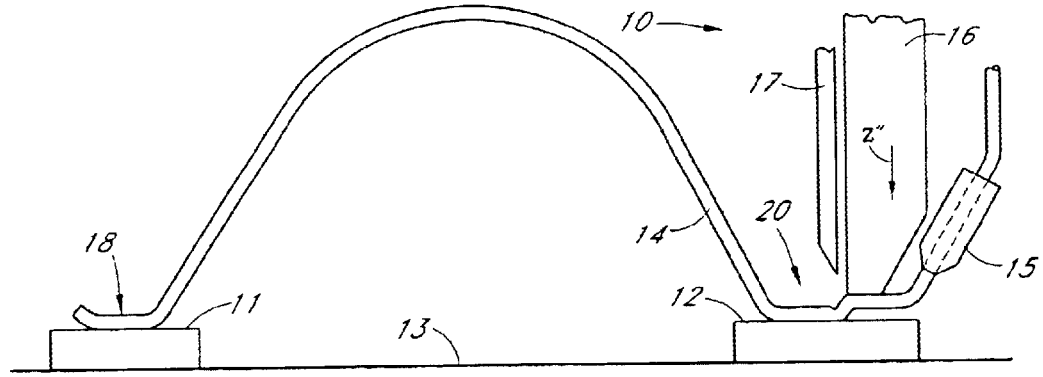
Figure 6:
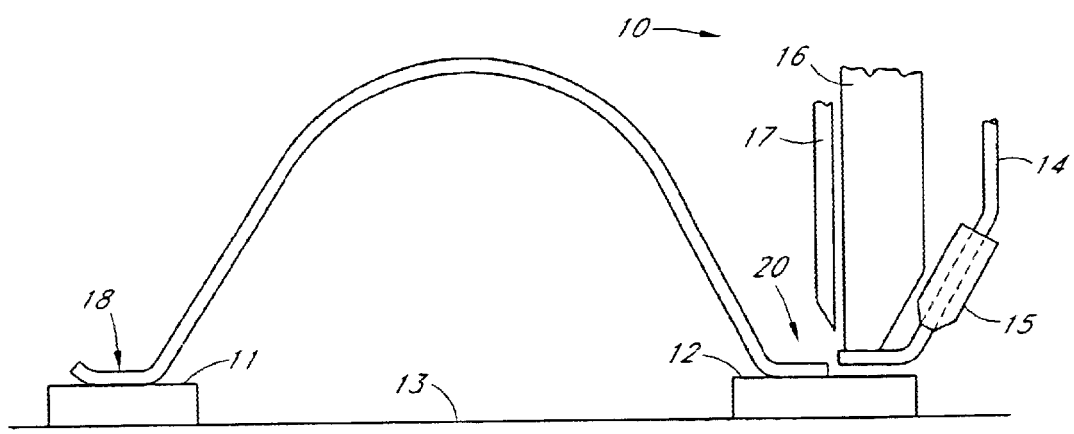

According to FIG. 5, as indicated by the left z-arrow under the second contact area 12, the bonding head is then moved upwards again, pulling the knife 17 out of the wire 14. Then the wedge 16—as symbolized by the z"-arrow in its interior—is pushed downwards. The bonding head is thereupon first moved laterally, in the direction of the xy-arrow below the second contact area 12, then lowered again as shown by the second z-arrow, and moved further in the XY plane, so that finally the state illustrated in FIG. 6 is reached, namely that the bond wire 14 has been completely transected at a point lateral to the second bond 20.

Figure 7:
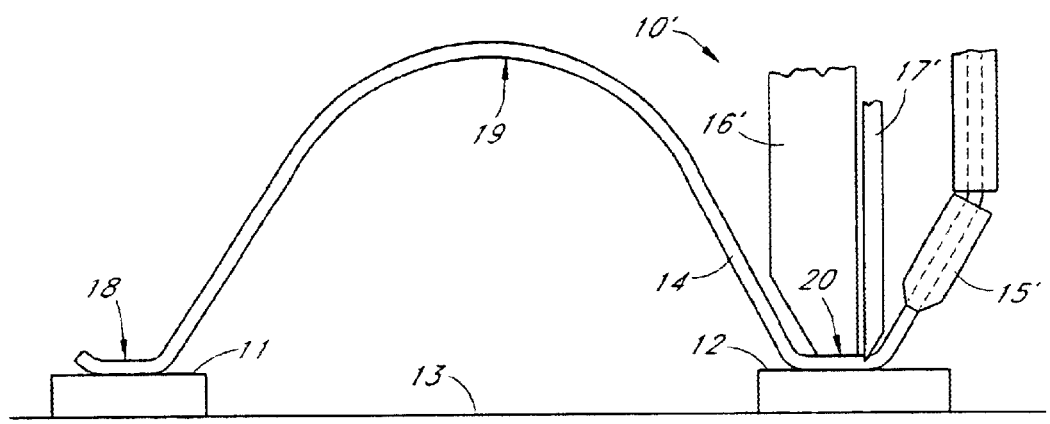

In FIG. 7 a modified embodiment of a wire bonder 10' is shown together with a bond-wire loop 19 of the kind represented in FIGS. 1 to 6. In this embodiment the knife 17', viewed from the direction in which the wire is being guided, is ahead of the wedge 16', i.e. between the wedge and the wire-guidance tubule 15'. In this case the transection of the bond wire 14 is accomplished immediately after the second touch-down onto the second contact area 12, as indicated in FIG. 7.

Figure 8:
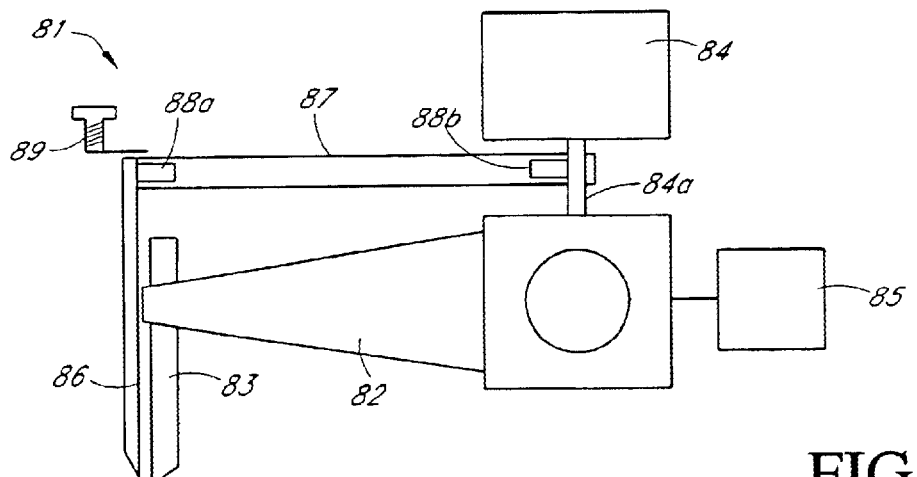
FIG. 8 is a sketch to show the principles of a bonded-wire-cutting device attached to a bonding head, according to a first embodiment of the invention.
Figure 9:
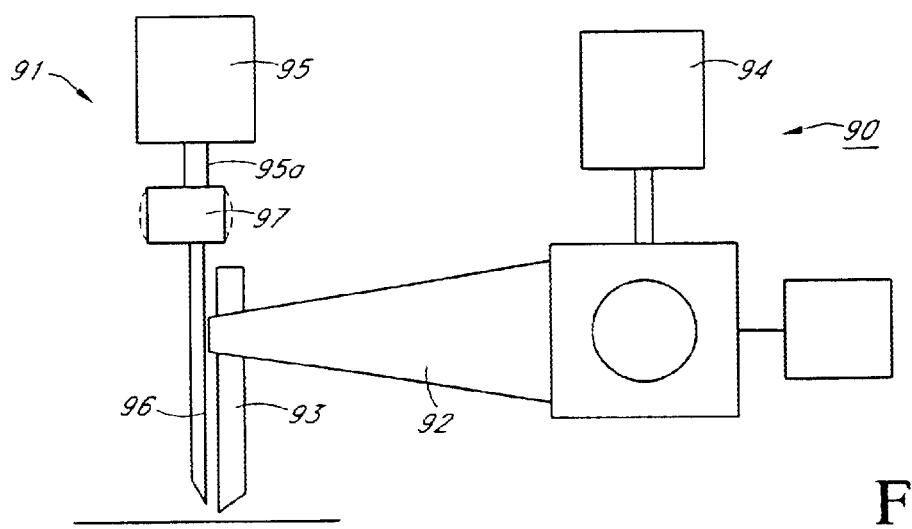
FIG. 9 is a sketch to show the principles of a bonded-wire-cutting device attached to a bonding head, according to a second embodiment of the invention.
Figure 10:
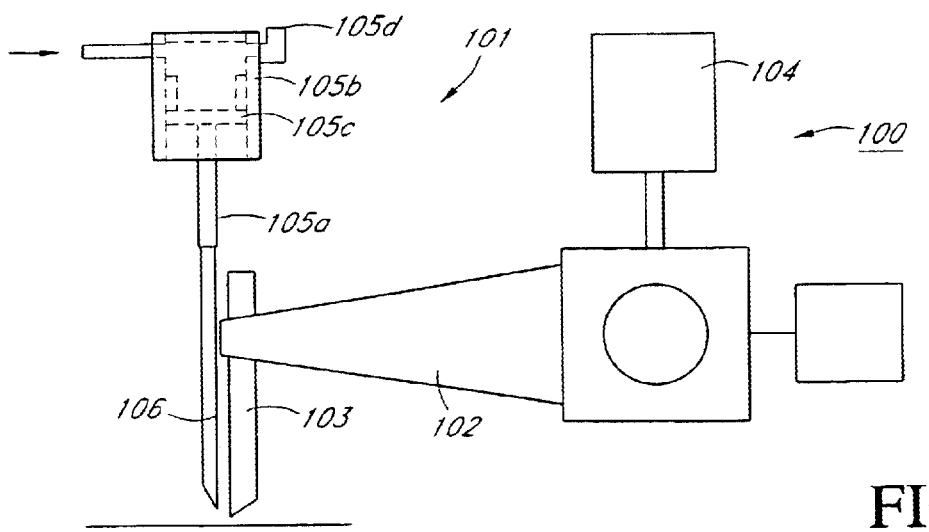
FIG. 10 is a sketch to show the principles of a bonded-wire-cutting device attached to a bonding head, according to a third embodiment-of the invention.

FIGS. 8 to 10 show schematic sections through a thick-wire bonder in which bond-wire-cutting devices 81, 91 and 101, corresponding to different embodiments of the invention, are disposed on the respective bonding heads 80, 90 and 100. Apart from the cutting devices, the bonding heads have the same structure, such that in each case an ultrasound transducer 82, 92 or 102 with attached bonding wedge 83, 93 or 103 is provided, all constructed in the conventional manner. With each transducer is associated a bonding drive unit 84, 94 or 104 to implement the upward and downward movement of the wedge described above.

In the embodiment according to FIG. 8 there is a single drive mechanism 84 with a drive rod 84a to move the relevant tools—the bonding wedge 83 and a knife 86—in the direction of the Z axis. So that between these movements the wedge can be raised or lowered according to the process sequence explained above (note in particular FIGS. 4 and 5 with associated description) there is provided a separate, in particular electromagnetically operating device to raise the transducer, the transducer-lift 85.

To cut away the bond wire (not shown in these figures), in the embodiments according to FIGS. 9 and 10 there is provided a separate cutter-drive device 95 or 105, with a drive rod 95*a* or 105*a*, respectively, to serve as force-transfer element. In these examples it is assumed that the drive mechanism 95 according to FIG. 9 is an electrical motor, whereas the cutter-drive device 105 according to FIG. 10 is a pneumatic drive with a pneumatic cylinder 105*b* and an associated piston 105*c*. The drive rod 105*a* is simultaneously the associated piston rod.

The knife 86 of the cutting device 81 according to FIG. 8 is mounted on the drive rod 84*a* so that it can move owing to elastic bending, by way of a double leaf spring 87 with elastomer blocks 88*a*, 88*b* fitted into its ends, and is guided close to the bonding wedge 83 so as to be vertically displaceable substantially parallel to the latter. Because of the cooperation between the bending elasticity of the double leaf spring 87 and the elastic deformability of the elastomer blocks 88*a*, 88*b* as well as the internal friction of this construction, a simultaneously flexible and damped suspension of the knife 86 on the drive rod 84*a* is achieved, and thereby also the desired peak-force limitation during the cutting process. A stopping device 89 that can be adjusted to different heights serves to limit the elastic displacement of the knife 86, when it encounters the substrate, to an adjustable value of about one to a few hundredths of a millimeter. Thus ultimately it is also possible to vary the damping characteristic of the knife suspension, which otherwise would be largely determined by the construction and the material constants of the double leaf spring 87 with the elastomer elements 88*a*, 88*b*.

In the bond-wire cutting device 91 according to FIG. 9, the cutter drive mechanism 95 is positioned some distance away from the basic body of the bonding head 90, so that the long axis of the drive rod 95*a* is in close proximity to the bonding wedge 93. Here the damped, yielding suspension of the knife 96, which is disposed in the long axis of the drive rod 95*a*, is achieved by an elastomer block 97 mounted between knife and drive rod. This is both (to a limited degree) elastic with respect to its shape and also compressible, and these properties in combination with the internal friction that accompanies deformation bring about the limited resiliency and damping of the knife suspension, and hence the peak-force limitation in accordance with the invention.

In the cutting device 101 according to FIG. 10, finally, the cylinder-piston unit 105*b*/105*c* of the drive mechanism 105 is likewise so arranged that the piston rod 105*a* is in close proximity to the bonding wedge 103. The knife 106 here is mounted directly on the piston rod 105*a*, and the desired peak-force limitation or damping when the knofe encounters a bond substrate is achieved by a pressure-release valve 105*d* on the pneumatic cylinder 105*b*, through which an unacceptably high interior pressure in the pneumatic cylinder, produced when the knife encounters the substrate, can escape.

The embodiment of the invention is not restricted to the sequence of steps and the examples described above, but is also possible in a large number of modifications that are within the competence of a person skilled in the art.

| List of reference numerals | |
|---|---|
| 10; 10' | Wire bonder |
| 11, 12 | Contact area |
| 13 | Component |
| 14 | Bond wire |
| 15; 15' | Wire-quidance tubule |
| 16; 16' | Wedge |
| 17; 17' | Knife |
| 18, 20 | Bond |
| 19 | Bond-wire loop |
| 21 | Tail length |
| 80; 90; 100 | Bonding head |
| 81; 91; 101 | Bond-wire cutting device |
| 82; 92; 102 | Ultrasound transducer |
| 83; 93; 103 | Bonding wedge |
| 84; 94; 104 | Bonding drive mechanism |
| 84a; 95a; 105a | Drive rod |
| 85 | Transducer-lift |
| 86; 96; 106 | Knife |
| 87 | Double leaf spring |
| 88a, 88b; 97 | Elastomer block |
| 89 | Stopping device |
| 95; 105 | Cutter drive mechanism |
| 105b | Pneumatic cylinder |
| 105c | Piston |
| 105d | Pressure relief valve |

What is claimed is:

1. A bond-wire cutting device for cutting off a part of a bond-wire that extends beyond a bonding contact area after a bonded connection has been produced, with a knife that can be moved with a movement component substantially perpendicular to the surface of a substrate and hence to the bonding contact area, wherein the knife is elastically mounted so as to be yielding to a limited extent with respect to the movement component substantially perpendicular to the substrate surface, in such a way that force acting on a cutting edge of the knife when the knife encounters the substrate is limited to a prespecified peak value and wherein the knife is connected by way of a bearing comprising an elastomer element that under pressure can change its shape elastically or is compressible to a force-transfer element that transmits the substantially perpendicular movement component.

2. The bond-wire cutting device according to claim 1, wherein the knife is connected by way of a holder that can bend elastically to the force-transfer element that transmits the substantially perpendicular movement component.

3. The bond-wire cutting device according to claim 2, wherein the elastically bendable holder has the form of a leaf-spring construction into which is inserted an elastomer block.

4. The bond-wire cutting device according to claim 1, wherein the knife is mounted hydraulically or pneumatically and the bearing comprises a hydraulic or pneumatic pressure-limiting element.

5. The bond-wire cutting device according to claim 2, further comprising a stopping device that limits the deflection of the knife.

6. The bond-wire cutting device according to claim 5, wherein the stopping device is designed to be displaceable so as to adjust the degree of yielding or the damping behavior of the holder of the knife.

7. The bond-wire cutting device according to claim 1, further comprising a common drive mechanism for a bonding tool and the knife.

8. The bond-wire cutting device according to claim 1, wherein the knife is yieldingly disposed on a bonding head of a wire bonder.

9. The bond-wire cutting device according to claim 1, wherein the elastomer element, under pressure, can change its shape elastically and is compressible.

10. The bond-wire cutting device of claim 4, wherein the pressure-limiting element comprises a pressure relief valve.

11. A bond-wire cutting device for cutting off a part of a bond-wire that extends beyond a bonding contact area after a bonded connection has been produced, with a knife that can be moved with a movement component substantially perpendicular to the surface of a substrate and hence to the bonding contact area, wherein the knife is mounted so as to be yielding to a limited extent with respect to the movement component substantially perpendicular to the substrate surface, in such a way that force acting on a cutting edge of the knife when the knife encounters the substrate is limited to a prespecified peak value and wherein the knife is mounted hydraulically or pneumatically and is connected by way of a bearing comprising a hydraulic or pneumatic pressure-limiting element.

12. The bond-wire cutting device according to claim 11, wherein the knife is elastically mounted.

13. The bond-wire cutting device according to claim 12, wherein the knife is connected by way of a holder that can bend elastically to the force-transfer element that transmits the substantially perpendicular movement component.

14. The bond-wire cutting device claim 13, wherein the elastically bendable holder has the form of a leaf-spring construction into which is inserted an elastomer block.

15. The bond-wire cutting device according to claim 13, wherein the bearing is elastic under pressure and is arranged to connect the knife to the force-transfer element that transmits the substantially perpendicular movement component.

16. The bond-wire cutting device according to claim 15, wherein the elastic bearing comprises an elastomer element that under pressure can change its shape elastically or is compressible.

17. The bond-wire cutting device according to claim 15, wherein the elastic bearing comprises an elastomer element that under pressure can change its shape elastically and is compressible.

18. The bond-wire cutting device according to claim 13, further comprising a stopping device that limits the deflection of the knife.

19. The bond-wire cutting device according to claim 18, wherein the stopping device is designed to be displaceable so as to adjust the degree of yielding or the damping behavior of the holder of the knife.

20. The bond-wire cutting device according to claim 11, further comprising a common drive mechanism for a bonding tool and the knife.

21. The bond-wire cutting device according to claim 11, wherein the knife is yieldingly disposed on a bonding head of a wire bonder.

22. The bond-wire cutting device of claim 11, wherein the pressure-limiting element comprises a pressure relief valve.

* * * * *

UNITED STATES PATENT AND TRADEMARK OFFICE
CERTIFICATE OF CORRECTION

PATENT NO. : 6,827,248 B2  Page 1 of 1
DATED : December 7, 2004
INVENTOR(S) : Farhad Farassat It is certified that error appears in the above-identified patent and that said Letters Patent is hereby corrected as shown below:

<u>Title page,</u>
Item [57], ABSTRACT,
Lines 1 and 2, please delete "bond wire" and insert -- bond-wire --.

<u>Column 7,</u>
Line 21, after "device" please insert -- according to --.

Signed and Sealed this

Twenty-seventh Day of September, 2005

JON W. DUDAS
*Director of the United States Patent and Trademark Office*